United States Patent [19]
Walby

[11] Patent Number: 4,797,848
[45] Date of Patent: Jan. 10, 1989

[54] PIPELINED BIT-SERIAL GALOIS FIELD MULTIPLIER

[75] Inventor: Douglas R. Walby, Pomona, Calif.

[73] Assignee: Hughes Aircraft Company, Los Angeles, Calif.

[21] Appl. No.: 853,529

[22] Filed: Apr. 18, 1986

[51] Int. Cl.[4] .......................... G06F 7/38; G06F 7/52
[52] U.S. Cl. ................................. 364/754; 364/746
[58] Field of Search .............. 364/746, 754, 757-760, 364/768

[56] References Cited

U.S. PATENT DOCUMENTS

| | | | |
|---|---|---|---|
| Re. 30,187 | 1/1980 | Hong et al. | 340/146.1 AL |
| 3,868,632 | 2/1975 | Hong et al. | 340/146.1 AL |
| 3,962,685 | 6/1976 | Belle Isle | 340/172.5 |
| 4,020,461 | 4/1977 | Adams et al. | 340/146.1 AL |
| 4,030,067 | 6/1977 | Howell et al. | 340/146.1 AL |
| 4,035,626 | 7/1977 | Christensen | 235/153 BB |
| 4,037,093 | 7/1977 | Gregg et al. | 235/164 |
| 4,107,652 | 8/1978 | Tanahashi et al. | 340/146.1 AL |
| 4,162,480 | 7/1979 | Berlekamp | 340/146.1 AL |
| 4,216,531 | 8/1080 | Chiu | 364/757 |
| 4,251,875 | 2/1981 | Marver et al. | 364/754 |
| 4,295,218 | 10/1981 | Tanner | 371/40 |
| 4,368,533 | 1/1983 | Kojima | 371/37 |
| 4,393,468 | 7/1983 | New | 364/736 |
| 4,402,045 | 8/1983 | Krol | 364/200 |
| 4,413,339 | 11/1983 | Riggle et al. | 371/38 |
| 4,567,600 | 1/1986 | Massey et al. | 375/2.1 |
| 4,587,627 | 5/1986 | Omura et al. | 364/754 |
| 4,697,248 | 9/1987 | Shirota | 364/754 |

Primary Examiner—Gary V. Harkcom
Assistant Examiner—Long Thanh Nguyen
Attorney, Agent, or Firm—A. W. Karambelas

[57] ABSTRACT

A bit-serial pipeline Galois Field Multiplier for multiplying an element $K(X) = K_{m-1}X^{m-1} + K_{m-2}X^{m-2} X^{m-2} + \ldots + K_0$ with another element $Y(X) = Y_{m-1}X^{m-1} + Y_{m-2}X^{m-2} + \ldots + Y_0$ to obtain $Z_0 = Z_{m-1}X^{m-1} + Z_{m-2}X^{m-2} + \ldots + Z_0$, which is also an element of the field generally defined by $P(X) = a_m X^m + a_{m-1}X^{m-1} + a_{m-2}X^{m-2} + \ldots a_1 X + a_0$. The multiplier has an input shift register buffer circuit, an intermediate shift register circuit, an output shift register circuit and multiplying and summing device. The input shift register buffer circuit is configured for serially receiving the K(X) coefficients. The multiplying and summing device receives arrangements of K(X) coefficients and the Y(X) coefficients and operates thereon, by multiplying corresponding pairs of register stage elements and Y(X) coefficients and summing the products. The output shift register circuit receives the resulting coefficients and, beginning m clock intervals after the inputting of K(X) and Y(X) coefficients is started, starts continuous outputing of the product coefficients $Z_{m-1}, Z_{m-2}, \ldots, Z_0$.

18 Claims, 3 Drawing Sheets

PIPELINED BIT-SERIAL GALOIS FIELD MULTIPLIER

This invention was made with Government support under Contract No. DAAK 20-81-C-0383 awarded by the Department of the Army.

BACKGROUND OF THE INVENTION

1. Field of the Invention

The disclosed invention generally relates to apparatus for Galois Field multiplication, and particularly to bit-serial Galois Field multipliers.

2. Description of Related Art

Data communications and processing systems transmit and receive digital data which are generally signal representations of binary bits. Since, during the transfer of data, errors sometimes occur, various techniques have been developed over the years for increasing the probability of error-free data transfer.

Particular error detecting and/or correcting techniques are directed to algebraic block codes wherein binary numbers are utilized to represent elements in a finite or Galois Field (GF). Specifically, a Galois Field ($2^m$) has $2^m$ elements each m bits in length. These field elements may be considered as binary vectors representing data words or "symbols." For example, a Galois Field ($2^3$) has eight elements, each three bits long. Typically, such Galois Field elements are multiplied in processes used to encode and decode messages for error correcting purposes. Error correcting code techniques, including the algegbra of Galois Fields, are described, for example, in "Error-Correcting Codes," by W. W. Peterson and E. J. Weldon, Jr., published by MIT Press, 1972.

Galois Field multiplication is fundamental in algebraic code techniques and usually involves complicated operations. One known technique for implementating Galois Field multiplication uses logarithmic look-up tables with intermediate shifting and adding steps. Another known technique for Galois Field multiplication involves shifting and adding the individual bits of the operands in a predetermined sequence. This shifting and adding technique is typically implemented with shift registers and/or common logic elements.

Still another method for performing Galois Field multiplication is implemented at the bit level, using "bit-serial" multipliers that accept m-bit symbols serially and produce bit-serial, m-bit output symbols. Such types of Galois Field multipliers are typically preferred in systolic array processors.

Specific examples of known Galois Field multipliers are disclosed in U.S. Pat. No. 4,037,093, issued to Gregg, et al.; U.S. Pat. No. 4,251,875, issued to Marver, et al. and U.S. Pat. No. 4,567,600 to Massey and Omura. Another known Galois Field multiplier is disclosed in "VLSI Design of a Reed-Solomon Encoder Using a Berlekamp Bit Serial Multiplier Algorithm," by I. S. Reed et al. (source unknown).

Known Galois Field multipliers have, however, generally been too complex or too specialized and hence of too limited capability. For example, the multiplication technique disclosed in the above-cited Massey and Omura patent cannot be used with Galois Field primitive root polynomials having linearly dependent roots; although, in practice, the most commonly encountered Galois Fields are those having linearly dependent roots. The multiplication technique of Berlekamp, on the other hand, is understood from the above-cited Reed et al. article to require representing the operands (i.e., symbols) in a dual basis which, in turn, requires translational logic, such as a ROM, between the two bases. A disadvantage of such a multiplication technique is that the size of the translational logic increases with the size of the field, and different logic is required for each different field.

Further, prior art Galois Field multipliers are relatively slow and, as a result, may be unable to operate at the speeds necessary to support required data rates with more powerful codes. Less powerful codes would thus be required to support the required data rates.

SUMMARY OF THE INVENTION

It is therefore an object of the invention to provide a Galois Field multiplier which operates at high speeds.

Another object of the invention is to provide a high speed bit-serial Galois Field multiplier.

Still another object of the invention is to provide a high speed pipelined Galois Field multiplier.

It is also an object of the invention to provide a high speed bit-serial Galois Field multiplier which utilizes as components a plurality of shift register circuits having similar feedback connections, the feedback connections being determined by the primitive polynomial that defines the Galois Field.

A further object of the invention is to provide a Galois Field ($2^m$) multiplier which utilizes the standard basis of Galois Field elements only and is capable of utilizing any primitive root polynomial with either linearly independent or linearly dependent roots.

The foregoing and other objects of the invention are provided in a Galois Field multiplier which includes a serial input, parallel output, input, feedback shift register buffer circuit for buffering the input coefficients of a multiplicand polynomial. Included is an intermediate parallel input, parallel output feedback shift register circuit which accepts the parallel transfer of the contents of the shift register buffer circuit when the entire set of multiplicand coefficients have been serially input thereto. Logic array means are connected for receiving, in parallel, the multiplier polynomial coefficients, for receiving in parallel the contents of the register stages of the intermediate shift register circuit for modulo multiplying the respective contents of the intermediate shift register circuit by the multiplier polynomial coefficients and for then summing the resulting products to provide a logic array output. The intermediate shift register circuit is periodically shifted so as to enable the outputting of a sequence of logic array outputs. A serial in, serial out output feedback shift register circuit serially accepts the output of the logic array to provide coefficients of the product polynomial. Each of the shift register circuits includes m shift register stages and feedback connections which are defined by the primitive root polynomial utilized to define the Galois Field GF($2^m$).

According to an embodiment of the invention, a Galois Field ($2^m$) multiplier apparatus is provided for multiplying two elements of a finite field represented by K(X) and Y(X) to obtain a product Z(X), K(X) having the form $K(X) = K_{m-1}X^{m-1} + K_{m-2}X^{m-2} + \ldots + K_0$ and Y(X) having the form $Y(X) = Y_{m-1}X^{m-1} + Y_{m-2}X^{m-2} + \ldots + Y_0$ and Z(X) having the form $Z(X) = Z_{m-1}X^{m-1} + Z_{m-2}X^{m-2} + \ldots + Z_0$. The multiplier apparatus comprises an input, feedback shift register buffer circuit having m serially arranged register stages $R_{m-1}, R_{m-2}, \ldots, R_0$ which are connected for serially receiving the K(X) coefficients and computing means connected for receiving, in parallel at a preselected clock pulse, the contents of the $R_{m-1}, R_{m-2}, \ldots, R_0$ register stages for the initiating register circuit and for serially receiving the Y(X) coefficients and for operating thereon to provide an intermediate series of m logic functions $S_i = f_{m-1}Y_{m-1} + f_{m-2}Y_{m-2} + \cdots + f_0Y_0$, wherein $f_{m-1}, f_{m-2}, \ldots, f_0$ are functions of $K_{m-1} K_{m-2}, \ldots, K_0$. Included in the apparatus is an output shift register circuit, having m serial arranged shift register stages $R_{m-1}'', R_{m-2}'', \ldots, R_0''$, which are connected for serially receiving the series of m logic functions $S_i$ from the computing means and, in response thereto, providing a serial output of the product coefficients $Z_{m-1}, Z_{m-2}, \ldots, Z_0$. Timing means are included for providing clock pulses to the initiating and output shift register circuits and to the computing means for synchronizing the operation thereof.

The input and output shift register circuits and the computing means are configured for enabling a continuous bit serial input of K(X) coefficients (multiplicand) into the initiating shift register circuit and a substantially continuous bit serial input of Y(X) coefficients (multiplier) into the computing means and, in response thereto, for enabling a continuous bit serial output of Z(X) coefficients (product) from the output shift register circuit. Preferably, the serial input of K(X) coefficients into the input shift register circuit and the serial input of the Y(X) coefficients into the computing means both start at the same clock pulse, the serial output of the Z(X) product coefficients from the output shift register circuit starting at a predetermined number N, which may be equal to m, of clock pulses thereafter.

In an embodiment of the invention, the computing means includes an intermediate shift register circuit having m serially arranged registers $R_{m-1}', R_{m-2}', \ldots, R_0'$, which are connected for receiving the contents of corresponding ones of the input shift register stages $R_{m-1}, R_{m-2}, \ldots, R_0$. Further, the computing means includes multiplying and summing means connected for receiving, in parallel, sets of contents of the $R_{m-1}', R_{m-2}', \ldots, R_0'$ register stages at predetermined clock pulses and for simultaneously receiving, in parallel, the Y(X) coefficients $Y_{m-1}, Y_{m-2}, \ldots, Y_0$. The multiplying and summing means are configured for multiplying corresponding pairs of the $R_{m-1}', R_{m-2}', \ldots, R_0'$ register stage contents and the $Y_{m-1}, Y_{m-2}, \ldots, Y_0$ coefficients and for summing the resulting products to provide the $S_i$ output, and include serial-to-parallel bit converting means for serially receiving the $Y_{m-1}, Y_{m-2}, \ldots, Y_0$ coefficients and for subsequently outputting such coefficients in parallel to the multiplying and summing means.

The input shift register buffer circuit, the intermediate shift register circuit and the output shift register circuit are preferred to be substantially identical to one another, all three shift register circuits including feedback means connected between the inputs thereof and at least one of the register stages associated therewith. The configuration of the feedback means is established by the form of the primitive root polynomial $P(X) = a_m X^m + a_{m-1} X^{m-1} + a_{m-2} X^{m-2} \cdots + a_m X + a_0$ associated with the Galois Field ($2^m$) involved in the multiplication operation by the apparatus. In this regard, the input shift register buffer circuit includes an input modulo adder connected to receive the K(X) coefficients and to the first-in-series registers stage $R_{m-1}$, the feedback means including feedback to the input modulo adder from only those register stages $R_{m-1}, R_{m-2}, \ldots, R_0$ which correspond to those coefficients $a_{m-1}, a_{m-2}, \ldots, a_0$ of the primitive root polynomial that are equal to 1, corresponding feedback is provided for the intermediate and output shift register circuits.

BRIEF DESCRIPTION OF THE DRAWINGS

The advantages and features of the disclosed invention will readily be appreciated by persons skilled in the art from the following detailed description when read in conjunction with the drawings, wherein.

In the following detailed description and in the several FIGS. of the drawing, like elements are identified with like reference numerals.

DETAILED DESCRIPTION

Figure 1:
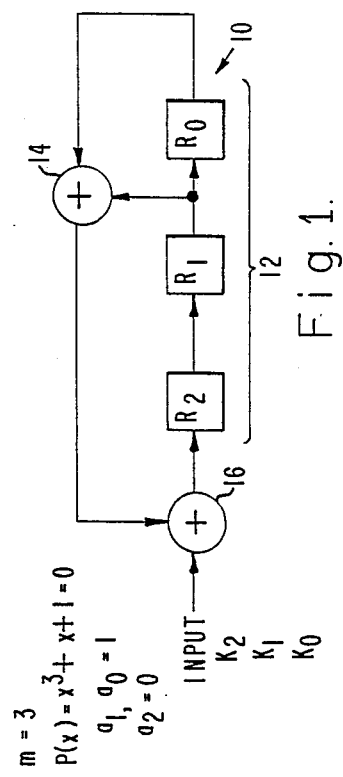
FIG. 1 is a schematic diagram of a particular shift register circuit which may be used with the disclosed Galois Field ($2^m$) multiplier for a simple, illustrative case for which m equal to 3 and for the polynomial $P(X) = X^3 + X + 1 = 0$, (the invention not, however, being limited to m=3).

As above mentioned, a Galois Field ($2^m$) is a finite field containing $2^m$ elements, each element being m binary bits long, wherein m can be any number. Typically, an element may be regarded as a binary vector representing a data word or symbol. Each of the elements in a Galois Field ($2^m$) may be represented by polynomials of degree $m-1$ or less wherein the bits are coefficients of the different powers of an indeterminate variable X. For example, for the simple case in which m is equal to 3, the binary symbol (1,0,1) can be expressed as $1*X^2 + 0*X + 1*1$, which can be simplified to $X^2 + 1$; in a similar manner, the symbol (1,1,0) can be expressed as $X^2 + X$. Because a Galois Field ($2^m$) is a finite field whose elements are determined by a primitive (prime) root polynomial of degree m, when the primitive root polynomial is specified, the field elements can be readily determined.

In conventional binary arithmetic, a common multiplication algorithm is the shift and add method in which the multiplicand is shifted to the left each time the next higher order bit in the multplier is tested. If the tested bit is a "1," the shifted version of the multiplicand is added in an accumulator. The same algorithm can be used with slight modification to perform multiplication in finite fields and is illustrated, for example, in the above-referenced "Error Correcting Codes," at page 180. A disadvantage of this approach is that the final product is, however, not available until $m-1$ clock cycles after the operands have been shifted in.

The approach to multiplication used in the present invention involves computing the product bit serially. An important advantage of this approach is that a valid product bit is produced each clock cycle and the approach is thus well suited to serial data transmission. Specific advantages of the invention over known bit-serial multipliers are that a bit-serial product is produced using only the normal basis of the field, any primitive root polynomial can be used, the hardware remains simple even as the field size becomes larger and the number of terms which need to be summed to generate any product bit is always equal to the number of bits in the field.

In general, according to the present invention, the desired product is computed bit-serially by generating a particular set of coefficients required for computing each product bit. For a simple multiplication of two polynomials, convolution may be used to obtain the proper coefficient sets for each degree in the product polynomial. By holding the coefficients of one polynomial fixed in a register and convolving the second polynomial so that the two highest order coefficients are the first to be paired, each successive step in the convolution will pair coefficients which are multiplied and summed to obtain the product coefficient for that degree. Each successive step in the convolution produces the coefficient set for the next lower degree of the product polynomial. The same technique may be applied to finite field (Galois Field) polylnomial multiplication, except that the product of two m-bit symbols (degree m−1 polylnomials) is also an m-bit symbol (degree m−1 polynomial) rather than a 2m−1 bit symbol, as would be the case in conventional binary multiplication. As a result, the product polynomial coefficients of order greater than or equal to m (the number of bits in the field) are replaced by lower order equivalents defined by the primitive root polynomial P(x) for the field used. The general form of the primitive root polynomial can be expressed as:

$$P(X) = a_i X^i + \ldots + a_1 X + a_0 = 0, \quad (1)$$

for which the following equality can be derived:

$$X^i = a_{i-1} X^{i-1} + a_{i-2} X^{i-2} + \ldots + a_1 X + a_0. \quad (2)$$

The equality of Equation 2 is derived from the additive inverse property of modulo 2 addition in which each element is its own additive inverse. Therefore, any two expessions which sum to zero must be equal to one another.

The general form of Equation 2 defines the representation of any degree coefficient in terms of lower degree equivalents. The specific form of Equations 1 and 2 for a given field is obtained when i is replaced by m (the number of bits in the field), and the $a_i$ coefficients are selected for the desired primitive root polynomial. As more particularly described below, feedback connections or taps in a series of m shift register stages are used to replace all higher order coefficients with their lower order equivalents, such feedback connections being made at each shift register stage for which the associated $a_i$ coefficient in Equation 1 is equal to 1.

The present invention can most readily be described and understood by first considering a relatively simple illustrative example for which m is equal to 3 and in which Equation 1 is equal to:

$$P(X) = X^3 + X + 1. \quad (3)$$

It is, of course, to be understood that the invention is in no way limited by this example and is equally applicable for all values of m.

For the exemplary P(X) of Equation 3, Equation 2 becomes:

$$P(a) = a^3 + a + 1 = 0, \quad (4)$$

from which is derived the following relationship:

$$a^3 = a + 1. \quad (5)$$

Powers of "a" that are 3 or higher can be reduced by Equation 5 to sums of lower powers of "a" shown in Table 1, which also shows the binary equivalent.

TABLE 1

| Powers of "a" | | | | | Binary Equivalent |
|---|---|---|---|---|---|
| $a^0 =$ | | | | $1 =$ | (001) |
| $a^1 =$ | | $a$ | | $=$ | (010) |
| $a^2 =$ | $a^2$ | | | $=$ | (100) |
| $a^3 =$ | | $a$ | $+$ | $1 =$ | (011) |
| $a^4 =$ | $a^2$ | $+a$ | | $=$ | (110) |
| $a^5 =$ | $a^2$ | $+a$ | $+$ | $1 =$ | (111) |
| $a^6 =$ | $a^2$ | | $+$ | $1 =$ | (101) |
| $a^7 =$ | | | | $1 =$ | (001) |

The operations of modular algebra between elements of a Galois Field ($2^m$) provide results which are also elements of the Galois Field ($2^m$). The multiplication can be manually accomplished by expressing each factor as a power of the root "a," multiplying the factors, expressing the resulting power of "a" in terms of lower powers of "a," and referring to a table, such as Table 1, to evaluate the product. However, hardware and/or software implementation of modular multiplication over a finite field is more typically accomplished by representing each factor as a polynomial. Such factors can be generally represented by the expressions:

$$K(X) = K_{m-1} X^{m-1} + K_{m-2} X^{m-2} + \ldots + X_0 \quad (6)$$

and $$Y(X) = Y_{m-1} X^{m-1} + Y_{m-2} X^{m-2} + \ldots + Y_0. \quad (7)$$

For the illustrative example in which m is equal to 3, Equations 6 and 7 become, respectively:

$$K(X) = K_2 X^2 + K_1 X + K_0 \quad (8)$$

$$Y(X) = Y_2 X^2 + Y_1 X + Y_0 \quad (9)$$

In Equations 6–9, significance of the bits represented by the coefficients increase with increasing powers of X. Multiplication of the factors of Equations 8 and 9 yields the product Z(X):

$$\begin{aligned} Z(X) = \ & (K_2 Y_2) X^4 + (K_2 Y_1 + K_1 Y_2) X^3 + \\ & (K_2 Y_0 + K_1 Y_1 + K_0 Y_2) X^2 + \\ & (K_1 Y_0 + K_0 Y_1) X + \\ & K_0 Y_0 . \end{aligned} \quad (10)$$

Since the product Z(X) is also an element of the field defined by the primitive root polynomial of Equation 3 (for m equal to 3), the Z(X) of Equation 10 can be evaluated by substituting the root "a" for the indeterminate (X) and by expressing the higher powers of the root "a" in terms of lower powers to provide a Z(a) equal to:

$$Z(a) = (K_2Y_0 + K_1Y_1 + K_0Y_2 + K_2Y_2)a^2 + \quad (11)$$
$$(K_1Y_0 + K_0Y_1 + K_2Y_1 + K_1Y_2 + K_2Y_2)a +$$
$$(K_0Y_0 + K_2Y_1 + K_1Y_2).$$

The foregoing Equation 11 for the product Z(a) can alternatively be expressed as:

$$Z(a) = Z_2 a^2 + Z_1 a + Z_0, \quad (12)$$

wherein, from Equation 11, $Z_2$, $Z_1$ and $Z_0$ are respectively equal to:

$$Z_2 = K_2Y_0 + K_1Y_1 + (K_0+K_2)Y_2 \quad (13)$$

$$Z_1 = K_1Y_0 + (K_0+K_2)Y_1 + (K_1+K_2)Y_2 \quad (14)$$

$$Z_0 = K_0Y_0 + K_2Y_1 + K_1Y_2. \quad (15)$$

From the foregoing, it is seen that multipication of polynomials in the finite field GF involves performing the multiplication and then expressing the resulting higher order powers in terms of lower order powers as defined by the primitive root polynomial utilized to define the field elements. The resulting product (for m equal to 3) is a three-bit symbol whose individual bits are defined by the coefficients of Equation 12, and in which the position of each bit is determined by the power of the root with which the corresponding coefficient is associated. Thus, the resulting symbol is ($Z_2$, $Z_1$, $Z_0$), wherein the respective values for $Z_2$, $Z_1$ and $Z_0$ are determined by Equations 13, 14 and 15, respectively.

For the product coefficient $Z_2$ of $a^2$, the individual factors of the multiplicand K(X) to be multiplied by the respective multiplier coefficients $Y_0$, $Y_1$ and $Y_2$ are, respectively, $K_2$, $K_1$, ($K_0+K_2$) which can be generated by a shift register circuit 10, shown in FIG. 1, which is configured for the exemplary m equal to 3. Specifically, shift register circuit 10 includes m serially arranged register stages $R_2$, $R_1$ and $R_0$ (for m equal to 3), collectively identified by reference number 12. A first input modulo adder 14 is connected for receiving separate feedback inputs from the stages $R_1$ and $R_0$, it being recalled that the feedback connections are made to each register stage corresponding to those $a_i$ coefficients in Equation 2 which are equal to 1. Because $a_2=0$, $a_1$ and $a_0$ equal to 1 for the example under discussion, the feedback connections shown in FIG. 1 are to register stages $R_1$ and $R_0$. A second input modulo adder 16 is connected for receiving an INPUT signal $K_2$, $K_1$ and $K_0$, and the output of the first modulo adder 14. Second modulo adder 16 outputs into first-in-series register stage $R_2$. In practice, the modulo adders 14 and 16 may comprise exclusive-OR gates.

The feedback connections of first modulo adder 14 provide time delayed versions of the input by second modulo adder 16 to shift register stage $R_2$, back to the input of the second modulo adder, for combining with the K(X) input thereto. The amount of time delay is determined by the respective differences between m (i.e., 3) and the lower powers of the prime polynomial of Equation 1 for the polynomial of Equation 3. Thus, time delays of 2 and 3 are provided by the feedback connections of first modulo adder 14 to shift register stages $R_1$ and $R_0$.

The coefficients $K_2$, $K_1$ and $K_0$ are shifted (clocked) through register stages $R_2$, $R_1$ and $R_0$ in most significant bit (MSB) first order. Register stages $R_2$, $R_1$ and $R_0$ contain the K(X) elements shown, for various time shifts, in Table 2.

TABLE 2

| Shifts | $R_2$ | $R_1$ | $R_0$ |
|---|---|---|---|
| 1 | $K_2$ | — | — |
| 2 | $K_1$ | $K_2$ | — |
| 3 | $K_0 + K_2$ | $K_1$ | $K_2$ |
| 4 | $K_1 + K_2$ | $K_0 + K_2$ | $K_1$ |
| 5 | $K_0$ | $K_1 + K_2$ | $K_0 + K_2$ |

It can be seen from Table 2 that multiplying the respective contents of the shift register stages $R_2$, $R_1$ and $R_0$ after three shifts by the respective multiplier coefficients $Y_2$, $Y_1$ and $Y_0$ and adding the products yields a symbol $S_2$:

$$S_2 = (K_0+K_2)Y_2 + K_1Y_1 + K_2Y_0. \quad (16)$$

After four shifts, multiplying the respective contents of the shift register stages $R_2$, $R_1$ and $R_0$ by the respective multiplier coefficients $Y_2$, $Y_1$ and $Y_0$ and adding the products yields a symbol $S_1$:

$$S_1 = (K_1+K_2)Y_2 + (K_0+K_2)Y_1 + K_1Y_0. \quad (17)$$

Similarly, after five shifts, multiplying the respective contents of the shift register stages $R_2$, $R_1$ and $R_0$ with the respective multiplier coefficient $Y_2$, $Y_1$ and $Y_0$ and adding the resulting products yields a third symbol $S_0$:

$$S_0 = K_0Y_2 + (K_1+K_2)Y_1 + (K_0+K_2)Y_0. \quad (18)$$

Comparing the expressions for $S_2$ (Equation 16) with the expression for $Z_2$ (Equation 13) reveals that $S_2$ is equal to $Z_2$. Similarly, by comparing Equation 17 and 14, it is seen that $S_1$ is equal to $Z_1$.

Comparing the expression for $S_0$ (Equation 18) with the expression for $Z_0$ (Equation 15) reveals, however, that $S_0$ is not equal to $Z_0$. However, adding $S_0$ to $S_2$ yields (for Equations 16 and 18):

$$S_0' = K_2Y_2 + K_2Y_1 + K_0Y_0. \quad (19)$$

Referring to the expression for $Z_0$ (Equation 15) reveals that $S_0'$ is equal to $Z_0$.

Thus, product coefficients $Z_2$, $Z_1$ and $Z_0$ can be generated by shift register circuit 10. After each of the third, fourth and fifth shifts, the respective contents of the register stages $R_2$, $R_1$ and $R_0$ are multiplied respectively by $Y_2$, $Y_1$ and $Y_0$, the products resulting after each such shift being summed to obtain the product sums $S_2$, $S_1$, $S_0$. The values of $S_2$ and $S_1$ are the values of $Z_2$ and $Z_1$ and the values for $Z_0$ is obtained by adding $S_0$ and $S_2$ to obtain $S_0'$.

Shift register circuit 10 can also be utilized to generate the product coefficients $Z_2$, $Z_1$ and $Z_0$ from the generated symbols $S_2$, $S_1$ and $S_0$. Specifically, with all register stages $R_2$, $R_1$ and $R_0$ cleared, serially inputting $S_2$, $S_1$ and $S_0$ to the second modulo adder 16 will yield, after three shifts, $Z_2$, $Z_1$ and $Z_0$ in stages $R_2$, $R_1$ and $R_0$ as shown in Table 3.

TABLE 3

| Shift | $R_2$ | $R_1$ | $R_0$ |
|---|---|---|---|
| 1 | $S_2$ | — | — |
| 2 | $S_1$ | $S_2$ | — |
| 3 | $S_0 + S_2$ | $S_1$ | $S_2$ |

Although register stages $R_2$, $R_1$ and $R_0$ of shift register circuit 10, as used to generate the product coefficients $Z_2$, $Z_1$ and $Z_0$, contain such coefficients, the coefficients are serially generated at the output of the second modulo adder 16. The product coefficients are thereby available as they are generated.

From the above, it is seen that shift register circuit 10 can be used both to generate factors to be multiplied by the multiplier factors $Y_2$, $Y_1$ and $Y_0$ and to process the resulting product sums to provide the product coefficients $Z_2$, $Z_1$ and $Z_0$. Accordingly, the foregoing concepts can be used to construct a pipelined Galois Field multiplier for a finite field $GF(2^m)$, a particular structure being described first for the simple, illustrative primitive root polynomial of Equation 3.

Figure 2:
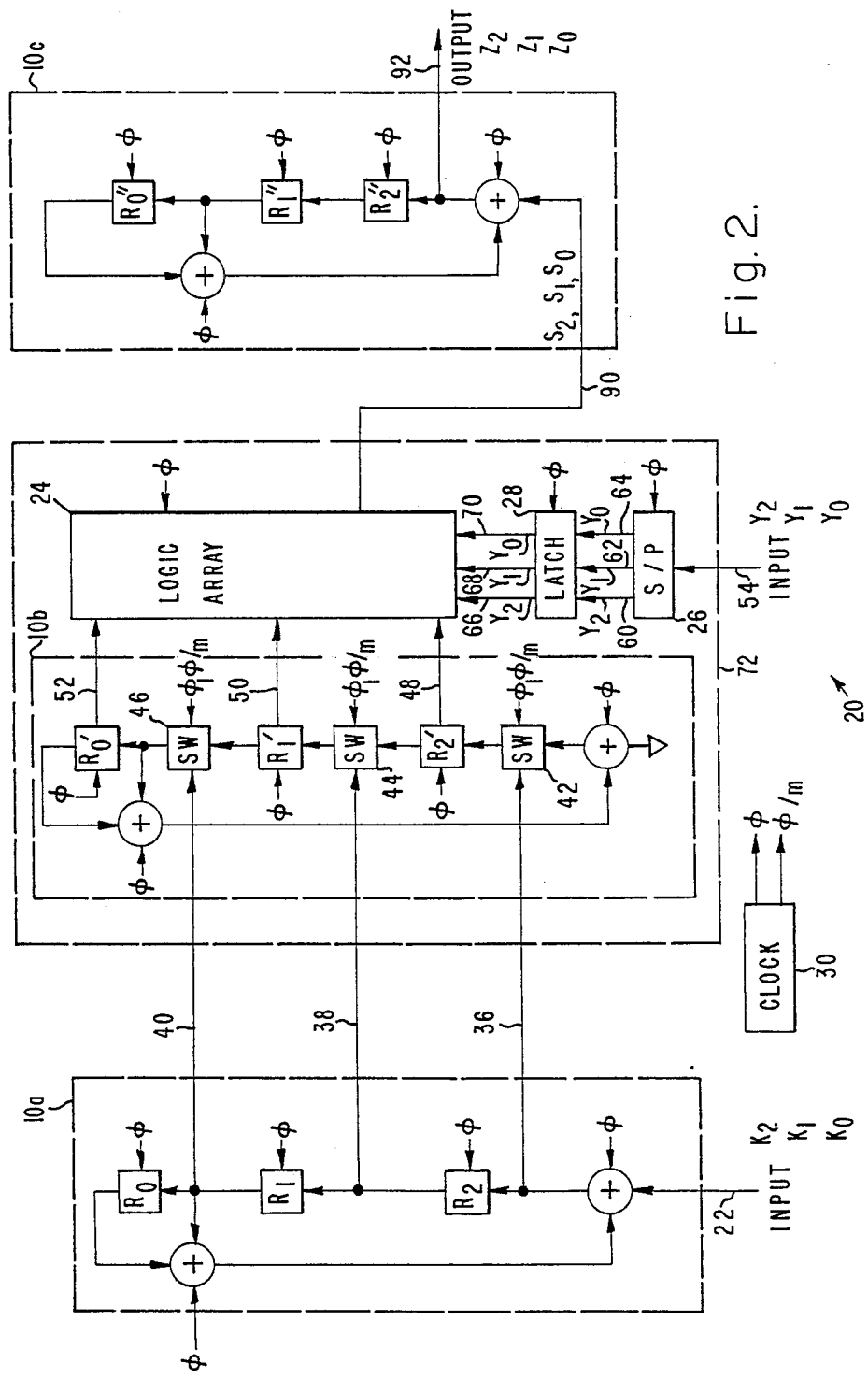
FIG. 2 is a block diagram of a specific Galois Field ($2^m$) multiplier apparatus for the invention and which utilizes the shift register circuit of FIG. 1.

Accordingly, FIG. 2 shows, in block diagram form, an exemplary bit serial Galois Field multiplier apparatus 20 for multiplying two polynomials in the field defined by the primitive root polynomial of Equation 3 for which m is equal to 3. Generally comprising multiplier apparatus 20 are an input, feedback shift register buffer circuit 10a, an intermediate, parallel in, parallel out shift register circuit 10b and a serial in, serial out output shift register circuit 10c. Shift register circuits 10a, 10b and 10c correspond generally to shift register circuit 10 (FIG. 1) except as described below. Further comprising multiplier apparatus 20 are a logic array 24, a serial-to-parallel bit converter 26 and latch 28, and a clock 30 which provides timing for the apparatus.

Input shift register buffer circuit 10a includes m equal to 3 serially arranged register stages $R_2$, $R_1$ and $R_0$; intermediate shaft register circuit 10b includes corresponding register stages $R_2'$, $R_1'$ and $R_0'$ and output shift register circuit 10c includes corresponding register stages $R_2''$, $R_1''$ and $R_0''$. First and second modulo adders 14a and 16a, respectively, are provided in input shift register buffer circuit 10a and are connected for feedback as described above for corresponding circuit 10, the second modulo adder being also connected to serially receive, over a conduit 22, the external inputs $K_2$, $K_1$ and $K_0$. Intermediate shift register circuit 10b includes first and second modulo adders 14b and 16b, respectively, connected as described for circuit 10 except that the external input of the second adder is grounded; alternatively, the second modulo adder may be entirely eliminated. Output register circuit 20c includes first and second modulo adders 14c and 16c connected, as described, for circuit 10 except that the external input of adder 16c is connected for receiving $S_2$, $S_1$ and $S_0$ intermediate product coefficients from logic array 24, as more particularly described below. Also, an output of output shift register circuit 10c provides the $Z_2$, $Z_1$ and $Z_0$ product coefficients.

Inputs to shift register stages $R_2$, $R_1$ and $R_0$ of input shift register circuit 10a are connected, by respective conduits 36, 38 and 40, to respective switches 42, 44 and 46 at inputs of corresponding register stages $R_2'$, $R_1'$ and $R_0'$ of working shift register circuit 10b. In turn, working shift register stages $R_2'$, $R_1'$ and $R_0'$ are connected by respective conduits 48, 50 and 52 to logic array 24. $Y_2$, $Y_1$ and $Y_0$ symbols are serially input, on a conduit 54, into serial-to-parallel circuit 26, which may comprise a shift register circuit similar to circuit 10. From serial-to-parallel circuit 26, the $Y_2$, $Y_1$ and $Y_0$ coefficients are input, in parallel, over conduits 60, 62 and 64, into latch 28 and from the latch into array 24 on conduits 66, 68 and 70.

Logic array 24 multiplies the contents of respective register stages $R_2'$, $R_1'$ and $R_0'$ of intermediate register circuit 10b with respective coefficients $Y_2$, $Y_1$ and $Y_0$ of the multipliers Y(X). The resulting products are summed to provide a series of intermediate coefficients of the form:

$$S_i R_2' Y_2 + R_1' Y_1 + R_0' Y_0, \qquad (20)$$

which, as can be seen, is of the form of $S_2$, $S_1$ and $S_0$ (Equations 14–16) described above.

Collectively, intermediate register circuit 10b, logic array 24, serial-to-parallel circuit 26 and latch 28 may be considered as comprising a computing means or stage 72.

Figure 3:
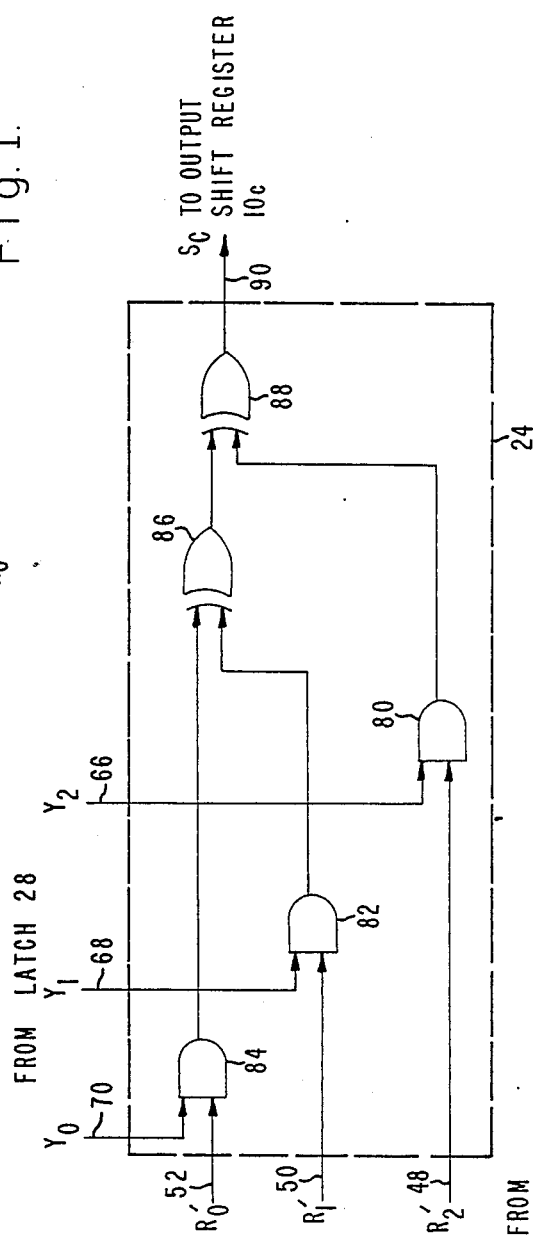
FIG. 3 is a circuit diagram of the logic array of the multiplier apparatus of FIG. 2.

Logic array 24 may preferably be implemented in the manner shown in FIG. 3, comprising respective first, second and third AND gates 80, 82 and 84, which provide the $R_i' Y_i$ multiplication, and respective first and second exclusive-OR gates 86 and 88, which provide product summing. First AND gate 80 receives, as inputs, the $Y_2$ coefficient of multiplier Y(X) and the contents of working shift register stage $R_2'$; second AND gate 82 receives, as inputs, the $Y_1$ coefficient of multiplier Y(X) and the contents of working shift register stage $R_1'$ and third AND gate 84 receives the $Y_0$ component of multiplier Y(X) and the contents of working shift register stage $R_0'$. In this regard, it is to be appreciated that the contents of working shift register stages $R_2'$, $R_1'$ and $R_0'$ vary according to the clocking sequence, as more particularly described below.

The outputs of second and third AND gates 82 and 84 are received, as inputs, by first exclusive-OR gate 86 and the outputs of such OR gate and of first AND gate 80 are received, as inputs, by second exclusive-OR gate 88. The outputs of second exclusive-OR gate 88 are the above-mentioned, intermediate $S_i$ coefficients, which are required to be the $S_2$, $S_1$ and $S_0$ coefficients of Equations 14–16.

Output shift register circuit 10c operates on the $S_i$ ($S_2$, $S_1$ and $S_0$), serially received, over a conduit 90, from coefficients output logic array 24 to provide, as an output thereof, on a conduit 92 (FIG. 2), the $Z_i$ ($Z_2$, $Z_1$ and $Z_0$) coefficients, it being recalled, from Equations 13 and 16, that $Z_2$ is equal to $S_2$; from Equations 14 and 17, that $Z_1$ is equal to $S_1$; and from Equations 15 and 19, that $Z_0$ is equal to $S_0'$, which, in turn, is equal to the sum $S_0 + S_2$ (Equations 16 and 18).

Operation of Galois Field Multiplier 20

In operation, the bits of the multiplicand coefficients $K_2$, $K_1$ and $K_0$ are shifted, MSB first, on conduit 22, into input shift register buffer circuit 10a in synchronization with the shifting, on conduit 54, of the bits (MSB first) of the multiplier coefficients $Y_2$, $Y_1$ and $Y_0$ into serial-to-parallel circuit 26. On shift 3 ($\phi = 3$), equal to the number of bits in each field element for m equal to 3, the contents, ($K_0 + K_2$), $K_1$ and $K_2$, from register stages $R_2$, $R_1$ and $R_0$ of input shift register buffer circuit 10a are switched, by respective switches 42, 44 and 46, into corresponding register stages $R_2'$, $R_1'$, and $R_0'$ of intermediate shift register circuit 10b, and input shift register stages $R_2$, $R_1$ and $R_0$ are cleared. Simultaneously, the $Y_2$, $Y_1$, and $Y_0$ contents of serial-to-parallel circuit 26 are shifted in parallel over conduits 60, 62 and 64 into latch 28 and output shift register circuit 10c is cleared. At this point, the coefficients for computing the MSB of the intermediate product coefficient $S_2$ are in working shift register stages $R_2'$, $R_1'$ and $R_0'$ and latch 28. From Table 2, it is seen that the respective contents of working shift registers $R_2'$, $R_1'$ and $R_0'$ are ($K_0 + K_2$), $K_1$ and $K_2$.

On shift 4 ($\phi=4$), the coefficients from intermeditate shift register stages $R_2'$, $R_1'$ and $R_0'$ (on respective conduits 48, 50 and 52) and from latch 28 (on respective conduits 66, 68 and 70) are input into logic array 24 and are multiplied (by AND gates 80, 82 and 84, FIG. 3) and summed (by exclusive-OR gates 86 and 88). The product bit ($S_2$) from logic array 26 is shifted, on conduit 90, into output shift register 10c where it is available, as an output of second modulo adder 16c on conduit 92, as $Z_2$. Also on shift 4, intermediate shift register 10b provides, on respective conduits 48, 50 and 52, the coefficients (from Table 2) ($K_1+K_2$), ($K_0+K_2$) and $K_1$ in register stages $R_2'$, $R_1'$ and $R_0'$, the first bit (MSB) of the next multiplicand K(X) is input, on conduit 22, to input shift register buffer circuit 10a and the first bit (MSB) of the next mulitiplier Y(X) is input, on conduit 54, into serial-to-parallel circuit 26.

On shift 5 ($\phi=5$), the second bit coefficients from intermediate shift register stages $R_2'$, $R_1'$ and $R_0'$ and from latch 28 are input, as was described above for the first bit coefficients, into logic array 24 and are multiplied and summed, the resulting product bit $S_1$ being shifted, on conduit 90, from the logic array into output shift register 10c where it is avaiable on conduit 92 as $Z_1$. At this clock time, $S_1$ and $S_2$ are respectively contained in output shift register stages $R_2''$ and $R_1''$. Also on shift 5, intermediate shift register 10b provides the coefficients (from Table 2) ($K_0$), ($K_1+K_2$) and ($K_0+K_2$) in respective register stages $R_2'$, $R_1'$ and $R_0'$.

On shift 6 ($\phi=6$), the remaining product bit $S_0$ is, in a like manner, obtained in logic array 26 and is input, over conduit 90, to output shift register circuit 10c. At this point, output shift register circuit 10c outputs, on conduit 92, $S_0+S_2$, which is equal to $Z_0$. On this clock, the final bits $K_0'(X)$ and $Y_0'(X)$ are respectively input, over conduits 22 and 54, into input shift register buffer circuit 10a and serial-to-parallel conduit 26. Also on shift 6 (and in general, on any multiple of the number m of bits in the field), the new contents of register stages $R_2$, $R_1$ and $R_0$ of input shift register circuit 10a are switched, by respective switches 42, 44 and 46, into intermediate shift register stages $R_2'$, $R_1'$ and $R_0'$ and the contents of serial-to-parallel circuit 26 are transferred into latch 28. The above operational sequence is repeated on subsequent shifts, the sequence of K(X) and Y(X) inputs and $Z_1$ outputs being summarized for shifts $\phi_1-\phi_9$ in Table 3.

TABLE 3

| | Inputs | | Outputs |
|---|---|---|---|
| Clock Cycles | Initiating Shift Register Circuit 10a | First Register Portion 46 | Output Shift Register Circuit 10c |
| $\phi_1$ | $K_2$ | $Y_2$ | |
| $\phi_2$ | $K_1$ | $Y_1$ | |
| $\phi_3$ | $K_0$ | $Y_0$ | |
| $\phi_4$ | $K_2'$ | $Y_2'$ | $Z_2$ |
| $\phi_5$ | $K_1'$ | $Y_1'$ | $Z_1$ |
| $\phi_6$ | $K_0'$ | $Y_0'$ | $Z_0$ |
| $\phi_7$ | $K_2''$ | $Y_2''$ | $Z_2'$ |
| $\phi_8$ | $K_1''$ | $Y_1''$ | $Z_1'$ |
| $\phi_9$ | $K_0''$ | $Y_0''$ | $Z_0'$ |

From the foregoing, it can be seen that the described configuration of Galois Field ($2^m$) multiplier apparatus 20 enables the continuous serial inputting of K(X) and Y(X) bits and, starting at shift 4 (m+1, in general), a continuous output of Z(X) product bits is provided, the output lagging the input, for any set of K(X), Y(X), by 3 (by m, in general) clock cycles or shifts. As a result, after 3 (m, in general) shifts, the multiplier pipeline is filled, and the output of product coefficients Z(X) occurs simultaneously with the input of next K(X) and Y(X) coefficients, with the mentioned 3(m) bit lag between input and output for any particular sets of coefficients.

Galois Field ($2^m$) multiplier apparatus 20 is readily expandable to any value of "m" and can be modified, by modifying the configuration of input, intermediate and output registers 10a, 10b and 10c of serial-to-parallel circuit 26 and of latch 28 according to the form of the primitive root polynomial P(X) and in a manner obvious to those of ordinary skill in the art. However, although configuration of registers 10a, 10b and 10c may change according to the form of P(X), only the three registers are required and the output Z(X) for a particular set of K(X) and Y(X) coefficients will lag the K(X), Y(X) inputs by "m" clock cycles. With respect to logic array 24, it can be seen from FIG. 3 that the number of AND gates required is equal to m and the number of Exclusive-OR gates required is equal to m−1.

The manner in which shift register circuits comparable to above-described shift register circuit 10 can be configured for any number m and for any field polynomial of the general type $P(X)=X^m+X^{m-1}+\ldots+X+1=0$, while considered obvious to those skilled in the art, is further illustrated in FIGS. 4–8 for examples of m=4 through m=8 and for various related P(X)s.

Figure 4:
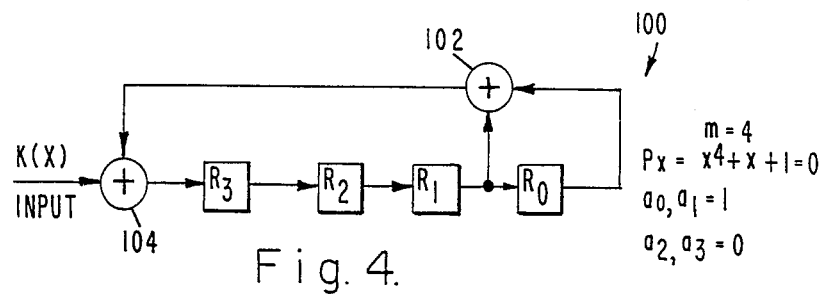
FIG. 4 is a block diagram of a shift register circuit for m=4 and $P(X) = X^4 + X + 1 = 0$.

There is thus shown in FIG. 4, in block diagram form, a shift register circuit 100 configured for m=4 and for the polynomial $P(X)=X^4+X+1=0$, wherein $a_0$ and $a_1=1$, and $a_2$ and $a_3=0$. Shift register circuit 100 is seen to comprise four shift register stages: $R_3$, $R_2$, $R_1$, and $R_0$ and two modulo adders 102 and 104. Feedback is provided from the $R_1$ and $R_0$ register stages (corresponding to $a_0$ and $a_1=1$), through modulo adder 102 to modulo adder 104, the latter modulo adder being the input to circuit 100 for receiving the K(X) elements.

Figure 5:
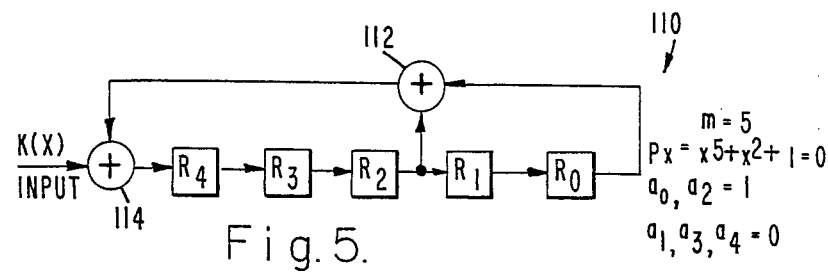
FIG. 5 is a block diagram of a shift register circuit for m=5 and $P(X) = X^5 + X^2 + 1 = 0$.

FIG. 5 shows, in block diagram form, a shift register circuit 110 configured for m=5 and $P(X)=X^5+X^2+1=0$, $a_0$ and $a_2$ equalling 1, whereas $a_1$, $a_3$ and $a_4=0$. Five shift register stages: $R_4$, $R_3$, $R_2$, $R_1$ and $R_0$ are included, with feedback, through a modulo adder 112 to an input modulo adder 114, from registers $R_2$ and $R_0$ (corresponding to $a_2$ and $a_0=1$).

Figure 6:
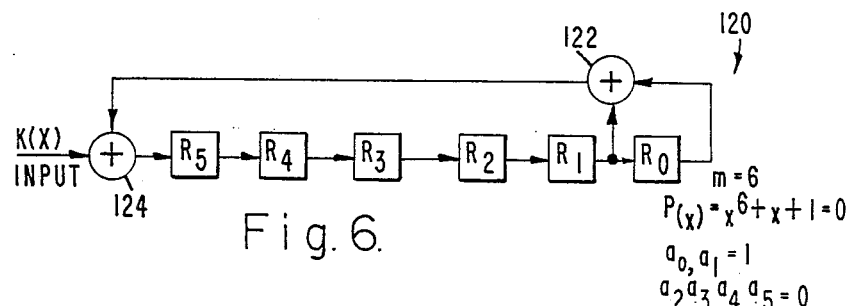
FIG. 6 is a block diagram of a shift register circuit for m=6 and $P(X) = X^6 + X + 1 = 0$.

A shift register circuit 120, having six shift register stages $R_5$, $R_4$, $R_3$, $R_2$, $R_1$ and $R_0$, is shown, in block diagram form, in FIG. 6 shift register circuit 120 is configured for m=6 and for the polynomial $P(X)=X^6=X=1=0$, wherein only $a_0$ and $a_1=0$, $a_2$, $a_3$, $a_4$ and $a_5$ equalling 0. Feedback is thus provided, through a modulo adder 122, to an input modulo adder 124 from register stages $R_1$ and $R_0$.

Figure 7:
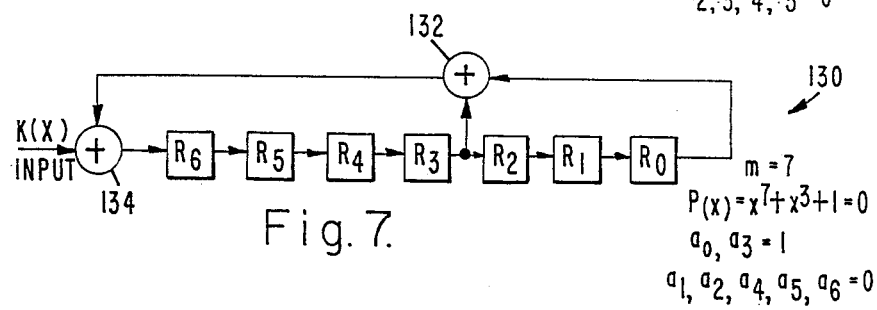
FIG. 7 is a block diagram of a shift register circuit for m=7 and $P(X) = X^7 + X^3 + 1$.

Shown in FIG. 7, for m=7 and the polynomial $P(X)=X^7+X^3+1=0$, is a shift register circuit 130 having feedback, through a modulo adder 132, to an input modulo adder 134, only from register stages $R_3$ and $R_0$ of seven register stages $R_6-R_0$, and corresponding to $a_3$ and $a_0=1$, all other a's equalling 0.

Figure 8:
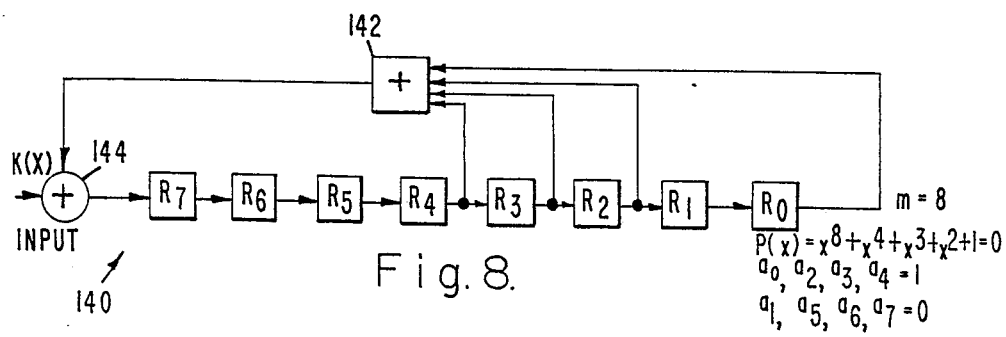
FIG. 8 is a block diagram of a shift register circuit for m=8 and $P(X) = X^8 + X^4 + X^3 + X^2 + 1 = 0$.

Finally, FIG. 8 depicts, also in block diagram form, a shift register circuit 140 having modulo adders 142 and 144 and eight register stages $R_7-R_0$. Circuit 140 is configured for m=8 and the polynomial $P(X)=X^8+X^4+X^3+X^2+1=0$, wherein $a_0$, $a_2$, $a_3$ and $a_4=1$ and $a_1$, $a_5$, $a_6$ and $a_7=0$. Feedback is thus provided, through modulo adder 142, from register stages $R_4$, $R_3$, $R_2$ and $R_0$ to input modulo adder 144.

Thus, although there have been described above specific embodiments of Galois Field ($2^m$) multiplier apparatus in accordance with the present invention for purposes of illustrating the manner in which the invention may be used to advantage, it is to be understood that the invention is not limited thereto. Therefore, all modifications and variations which may occur to those skilled in the art are to be considered to be within the scope and spirit of the invention as defined in the appended claims.

What is claimed is:

1. A pipeline Galois Field ($2^m$) multiplier for multiplying elements of a finite field, represented by factors K(X) and Y(X), to obtain a product Z(X), wherein K(X) has the form $K(X) = K_{m-1}X^{m-1} + K_{m-2}X^{m-2} + \ldots + K_0$, Y(X) has the form $Y(X) = Y_{m-1}X^{m-1} + Y_{m-2}X^{m-2} + \ldots + Y_0$ and Z(X) has the form $Z(X) = Z_{m-1}X^{m-1} + Z_{m-2}X^{m-2} + \ldots + Z_0$, said multiplier apparatus comprising:

(a) a serial in, parallel out input shaft register buffer circuit having m serially arranged register stages $R_{m-1}, R_{m-2}, \ldots, R_0$ and being connected for serially receiving the K(X) coefficients $K_{m-1}, K_{m-2}, \ldots, K_0$;

(b) computer means connected for receiving, in parallel, at a preselected clock pulse, the contents of the $R_{m-1}, R_{m-2}, \ldots, R_0$ register stages of the initiating register circuit and for serially receiving the Y(X) coefficients $Y_{m-1}, Y_{m-2}, \ldots, Y_0$, and for operating thereon to provide an intermediate series of m logic functions $S_i = f_{m-1}Y_{m-1} + f_{m-2}Y_{m-2} + \ldots + f_0Y_0$, wherein $f_{m-1}, f_{m-2}, \ldots, f_0$ are functions of $K_{m-1}, K_{m-2}, \ldots, K_0$;

(c) a serial in serial out output shift register circuit having m serial arranged shift register stages $R_{m-1}'', R_{m-2}'', \ldots, R_0''$ and being connected for serially receiving the series of m logic functions $S_i$ from the computing means and, in response thereto, providing a serial output of Z(X) product coefficients $Z_{m-1}, Z_{m-2}, \ldots, Z_0$; and (d) timing means for providing clock pulses to the input and output shift register circuits and to the computing means for synchronizing the operation thereof.

2. The Galois Field ($2^m$) multiplier as claimed in claim 1 wherein the input and output shift register circuits and the computing means are configured for enabling a substantially continuous input of K(X) coefficients into the input shift register buffer circuit and a substantially continuous input of Y(X) coefficients into the computing means and for enabling a substantially continuous output of Z(X) coefficients from the output shift register circuit.

3. The Galois Field ($2^m$) multiplier as claimed in claim 2 wherein the serial input of K(X) coefficients into the input shift register buffer circuit and the serial input of the Y(X) coefficients into the computing means both start at the same clock pulse and the serial output of the Z(X) coefficients from the output shift register circuit starts a predetermined number N of clock pulses thereafter.

4. The Galois Field ($2^m$) multiplier as claimed in claim 3 wherein the number N is equal to m.

5. The Galois Field ($2^m$) multiplier as claimed in claim 1 wherein the computing means includes an intermediate shift register having m serially arranged registers $R_{m-1}', R_{m-2}', \ldots, R_0'$, said register stages $R_{m-1}', R_{m-2}', \ldots, R_0'$ being connected for receiving the contents of corresponding ones of the register stages $R_{m-1}, R_{m-2}, \ldots, R_0$ of the input shift register buffer circuit.

6. The Galois Field ($2^m$) multiplier as claimed in claim 5 wherein the computing means includes multiplying and summing means connected for receiving, in parallel, the contents of the register stages $R_{m-1}', R_{m-2}', \ldots, R_0'$ at predetermined clock pulses and for simultaneously receiving, in parallel, the Y(X) coefficients $Y_{m-1}, Y_{m-2}, \ldots, Y_0$, said multiplying and summing means being configured for multiplying corresponding pairs of the $R_{m-1}', R_{m-2}', \ldots, R_0'$ stage contents and the $Y_{m-1}, Y_{m-2}, \ldots, Y_0$ coefficients and summing the resulting products to provide said $S_i$ output.

7. The Galois Field ($2^m$) multiplier as claimed in claim 6 wherein the computing means include serial-to-parallel bit converting means for serially receiving the $Y_{m-1}, Y_{m-2}, \ldots, Y_0$ coefficients and for subsequently outputting said $Y_{m-1}, Y_{m-2}, \ldots, Y_0$ coefficients in parallel for the multiplying and summing means.

8. The Galois Field ($2^m$) multiplier as claimed in claim 5 wherein the input shift register buffer circuit, the intermediate shift register circuit and the output shift register circuit are substantially identical to one another.

9. The Galois Field ($2^m$) multiplier as claimed in claim 8 wherein the input shift register buffer circuit, the intermediate shift register circuit and the output shift register circuit each includes feedback means connected between the input thereto and the corresponding register stages.

10. The Galois Field ($2^m$) multiplier as claimed in claim 9 wherein the input shift register buffer circuit includes an input modulo adder connected to receive the K(X) coefficients and to the first-in-series register stage $R_{m-1}$ and wherein the feedback means includes feedback to the input modulo adder from those of the register stages $R_{m-1}, R_{m-2}, \ldots, R_0$ which correspond to those coefficients $a_{m-1}, a_{m-2}, \ldots, a_0$ of the primitive root polynomial that are equal to 1, and wherein corresponding feedback is provided for the intermediate shift register circuit and the output shift register circuit.

11. The Galois Field ($2^m$) multiplier as claimed in claim 10 wherein the preselected clock pulse of which the computing means receives the contents of the initiating shift register stages $R_{m-1}, R_{m-2}, \ldots, R_0$ is about the mth clock cycle after input of the K(X) and Y(X) elements input is initiated.

12. A pipeline Galois Field ($2^m$) multiplier for multiplying a field element of the form $K(X) = K_{m-1}X^{m-1} + K_{m-2}X^{m-2} + \ldots + K_0$ by another field element of the form $Y(K) = Y_{m-1}X^{m-1} + Y_{m-2}X^{m-2} + \ldots + Y_0$ to obtain the product $Z(X) = Z_{m-1}X^{m-1} + Z_{m-2}X^{m-2} + \ldots + Z_0$, the field being characterized by the primitive root polynomial $P(X) = a_mX^m + a_{m-1}X^{m-1} + \ldots + a_1X + a_0$, wherein at least some by the coefficients $a_{m-1}, a_{m-2}, \ldots, a_0$ are equal to 1 and the others of said coefficients $a_{m-1}, a_{m-2}, \ldots, a_0$ are equal to 0, the multiplier comprising:

(a) input shift register buffer means including m serially arranged shift register stages $R_{m-1}, R_{m-2}, \ldots, R_0$, and being connected for serially receiving the K(X) coefficients $K_{m-1}, K_{m-2}, \ldots, K_0$ and for providing in response thereto, after m shifts, a pre-established initial arrangement of the K(X) coefficients in said register stages $R_{m-1}, R_{m-2}, \ldots, R_0$;

(b) intermediate shift register means including serially arranged shift register stages $R_{m-1}', R_{m-2}', \ldots$, $R_0'$ and being connected for receiving, in parallel, said initial arrangement of $K(X)$ coefficients from the initiating shift register stages $R_{m-1}, R_{m-2}, \ldots, R_0$ into said shift register stages $R_{m-1}', R_{m-2}', \ldots, R_0'$ and for providing in response thereto, a sequence of m sets of particular arrangements of $K(X)$ coefficients in the $R_{m-1}', R_{m-2}', \ldots, R_0'$ register stages;

(c) multiplying and summing means connected for serially receiving the $Y(X)$ coefficients, $Y_{m-1}, Y_{m-2}, \ldots, Y_0$ and for serially receiving the sequence of m sets of $K(X)$ coefficients from the intermediate shift register stages $R_{m-1}', R_{m-2}', \ldots, R_0'$ for multiplying individual ones of said m sets of $K(X)$ coefficients with corresponding ones of the $Y(X)$ coefficients to produce a set of m products for each said set and summing the resulting said m products from each of said m sets to provide an output sequence of m intermediate product coefficients $S_i = S_{m-1}, S_{m-2}, \ldots, S_0$, which correspond to a sequence of m sets of particular arrangements of $K(X)$ coefficients received from the working shift registers $R_{m-1}', R_{m-2}', \ldots, R_0'$;

(d) output shift register means including m serially arranged register stages $R_{m-1}'', R_{m-2}'', \ldots, R_0''$ and being connected for serially receiving the sequence of m intermediate product coefficients $S_i$ from the multiplying and summing means and for providing, in response thereto, a sequence of $Z(X)$ coefficients, $Z_{m-1}, Z_{m-2}, \ldots, Z_0$; and (e) timing means for timing the operation of the input shift register buffer means, the intermediate shift register means, the multiplying and summing means and the output shift register means by providing clock pulses thereto.

13. The Galois Field ($2^m$) multiplier as claimed in claim 12 wherein there are m of said $K(X)$ coefficients, $K_{m-1}, K_{m-2}, \ldots, K_0$, m of said $Y(X)$ coefficients, $Y_{m-1}, Y_{m-2}, \ldots, Y_0$, m of said $S_i$ intermediate coefficient $S_{m-1}, S_{m-2}, \ldots, S_0$ and m of said $Z(X)$ coefficients $Z_{m-1}, Z_{m-2}, \ldots, Z_0$ and wherein the input shift register buffer means, the intermediate shift register means, the multiplying and summing means and the output shift register means are configured for enabling the output shift register means to continuously provide the sequence of $Z(X)$ coefficients at a rate of one coefficient per clock pulse.

14. The Galois Field ($2^m$) multiplier as claimed in claim 13 wherein the output shift register means provide the first one of the sequence of $Z(X)$ coefficients about m clock pulses after the first one of the $K(X)$ elements is received by the initiating shift register means.

15. The Galois Field ($2^m$) multiplier as claimed in claim 13 wherein the multiplying and summing means are configured for receiving sequential one of the $Y(X)$ coefficient, $Y_{m-1}, Y_{m-2}, \ldots, Y_0$ at the same clock pulse that corresponding ones of the $K(X)$ coefficients $K_{m-1}, K_{m-2}, \ldots, K_0$ are received by the input shift register buffer means.

16. The Galois Field ($2^m$) multiplier as claimed in claim 12 wherein the multiplying and summing means includes multiplying means and serial-to-parallel converting means, said multiplying means being connected for serially receiving m sets of particular arrangements of $K(X)$ coefficient from the register stages $R_{m-1}', R_{m-2}', \ldots, R_0'$, the contents of said $R_{m-1}', R_{m-2}', \ldots, R_0'$ register stages, comprising each said set of particular arrangements, being received in parallel by the multiplying means, said converting means being connected for serially receiving the $Y(X)$ coefficients and for outputting the set of m of said $Y(X)$ coefficients in parallel to the multiplying means each time the multiplying means receives one of said sets of particular arrangements of $K(X)$ coefficients from the $R_{m-1}', R_{m-2}', \ldots, R_0'$ register stages.

17. The Galois Field ($2^m$) multiplier as claimed in claim 12 wherein each of the input shift register means, the intermediate shift register means and the output shift register means include feed back means connected from predetermined stages of the respective $R_{m-1}, R_{m-2}, \ldots, R_0; R_{m-1}', R_{m-2}', \ldots, R_0'$ and $R_{m-1}'', R_{m-2}'', \ldots, R_0''$ register stages back to the input of the respective $R_{m-1}, R_{m-1}',$ and $R_{m-1}''$ register stages.

18. The Galois Field ($2^m$) multiplier as claimed in claim 17 wherein said predetermined stages of the register stages $R_{m-1}, R_{m-2}, \ldots, R_0; R_{m-1}', R_{m-2}', \ldots, R_0'$ and $R_{m-1}'', R_{m-2}'', \ldots, R_0''$ are selected to correspond to those of said $a_{m-1}, a_{m-2}, \ldots, a_0$ coefficients of the primitive root polynomial that are equal to 1, $a_{m-1}$ corresponding to register stages $R_{m-1}, R_{m-1}'$ and $R_{m-1}''$, $a_{m-2}$ corresponding to register stages $R_{m-2}, R_{m-2}', R_{m-2}''$, and so forth.

* * * * *